METHOD OF MANUFACTURING INTEGRATED SEMICONDUCTOR CIRCUIT DEVICE

Filed June 27, 1966

United States Patent Office 3,445,927

Patented May 27, 1969

3,445,927

METHOD OF MANUFACTURING INTEGRATED SEMICONDUCTOR CIRCUIT DEVICE

Hans Ullrich, Munich, and Erhard Sussmann, Poing, Germany, assignors to Siemens Aktiengesellschaft, Berlin, Germany, a corporation of Germany Filed June 27, 1966, Ser. No. 560,409
Claims priority, application Germany, June 29, 1965, S 97,877
Int. Cl. B01j 17/00; H01l 5/00
U.S. Cl. 29—578 7 Claims

ABSTRACT OF THE DISCLOSURE

Described is a method of producing an integrated circuit with several electrical components arranged in a single semiconductor body. One main surface of a semiconductor disc is coated, from a gaseous phase, with an insulating layer, and the opposite main surface of the semiconductor disc is coated in at least two completely separated regions, with an insulating protective layer, for example $SiO_2$. A doping substance from the gaseous phase is indiffused into the free semiconductor surface between the individual regions of protective layer and produces the opposite conductance type to that of the semiconductor disc, which is impermeable to said regions of protective layer. The doping material is diffused into the exposed portions of the semiconductor surface to such a depth that the conductance type of the semiconductor material beneath the exposed semiconductor surface reverses everywhere into the opposite type while only beneath the regions of protective layer remain regions of the original conductance type of the semiconductor disc, which are completely separated from each other by regions of opposite conductance type but bordered by protective layer following at least a partial removal of protective layer. These regions are further processed into components of integrated circuits.

Figures 1, 2, 3, 4, 5, 6, 7:
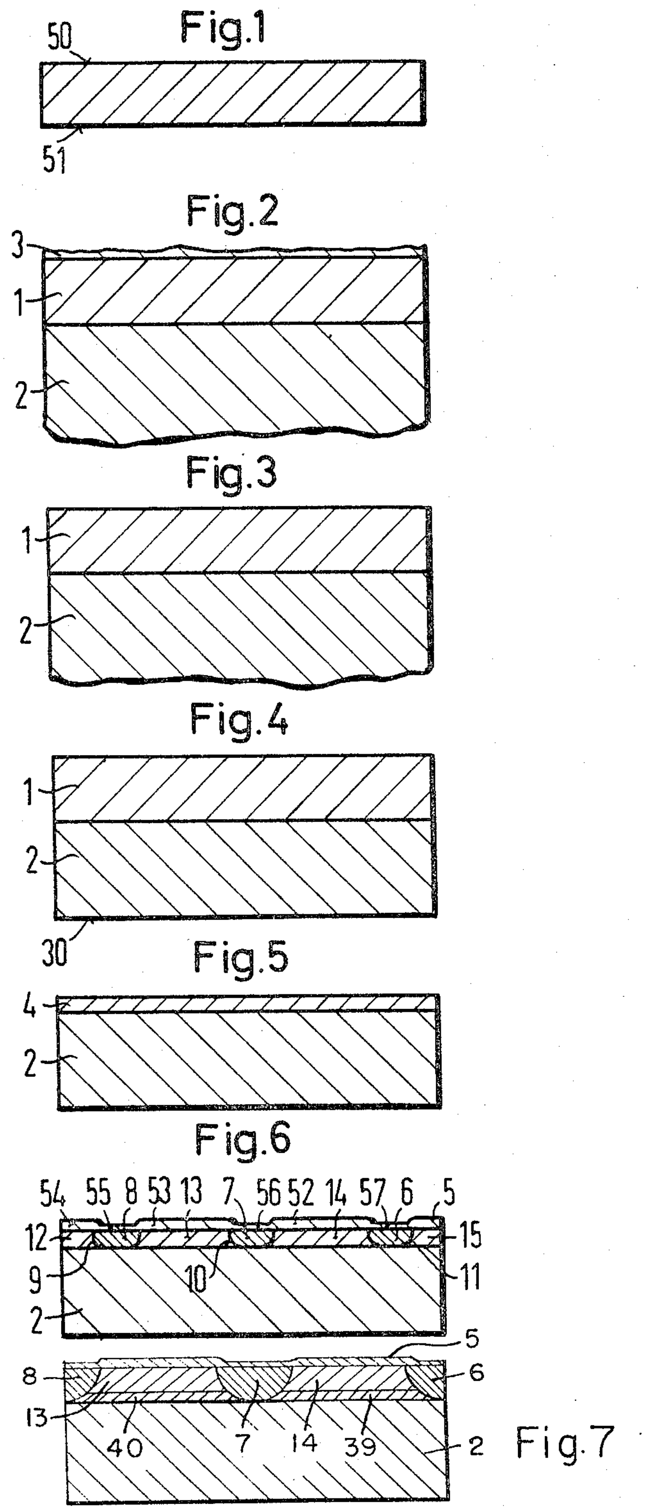

Our invention relates to integrated semiconductor circuits and to a method of manufacturing them.

Devices of this type have electrically active and passive components of a circuit or network embodied on a single substrate of semiconductor material. Such integrated circuits, also called solid-state circuits or microcircuits, have the individual active and passive components of the circuitry separated from each other by p-n junctions which are biased in the blocking direction. Although a p-n junction, by virtue of the slight residual currents, effects a relatively good ohmic decoupling, the circuit components remain capacitively intercoupled because of the relatively large capacitances of the p-n junctions. Such capacitive couplings have detrimental effects particularly at high frequencies.

It is an object of our invention to afford isolating the active and passive semiconductor components within the wafer or substrate of an integrated circuit in such a manner that ohmic as well as capacitive couplings between the components are reduced to a minimum.

To this end and in accordance with the invention, we provide a wafer or plate-shaped body of electrically insulating material, particularly the oxide of a semiconductor material, with a thin layer or film of semiconductor material whose thickness is slight in comparison with that of the insulating wafer. We further provide the semiconductor layer, having a given type of conductance, with partitioning regions that completely penetrate the semiconductor layer in directions perpendicular to the layer type surface and form a capacitive and ohmic isolation between those portions of the semiconductor layer that remained unchanged. Consequently, upon or within the insulating wafer there are formed islands of monocrystalline semiconductor material which contain the active and passive components respectively of the integrated circuitry and whose geometrical shapes are accurately defined.

According to a more specific feature of the invention, the partitioning regions which effect the capacitive and ohmic separation consist of semiconductor material whose type of conductance is opposed to that of the thin semiconductor layer.

According to an alternative feature of the invention, the partitioning regions are formed as recesses in the semiconductor layer. The semiconductor layer, therefore, possesses regions in which the semiconductor material is completely removed.

According to still another feature of the invention, the partitioning regions within the semiconducting layer consist of the same insulating material as the insulating layer or wafer and form part thereof.

In a semiconductor integrated circuit according to the invention, the insulating layer or wafer, having relatively great thickness, constitutes the carrier or substrate for the semiconductor layer in which the active and passive elements of the circuitry are located, so that this semiconductor layer can be made extremely thin. This has the consequence that the boundary faces between the semiconductor layer and the regions that effect the capacitive and ohmic separation possess extremely slight dimensions. As a result, coupling capacitances occurring between the semiconductor layer in the regions of opposed conductance type, as are provided in accordance with one of the alternative features of the invention, are very slight and have no longer a disturbing effect even at very high frequencies.

According to a further feature of the invention, we cover the free surface of the semiconductor layer, particularly the semiconductor surface facing away from the insulating wafer, with a protective coating which is thin relative to the semiconductor layer and consists of electrically insulating material, preferably of the oxide of the semiconductor material. This provides for protection of the active and passive circuit components arranged within the islands of monocrystalline semiconductor material, and particularly protects the p-n junctions where they emerge at the semiconductor surface. In a preferred embodiment of the invention the insulating wafer as well as the protective coating consist of an oxide, particularly an oxide of the semiconductor material.

According to still another feature of the invention, the thin semiconductors layer possesses in the regions adjacent to the insulating wafer a higher conductivity than elsewhere. This improves the electrical data of the circuit components, especially any transistors, contained in the circuitry. At very high frequencies, such a layer of higher conductivity adjacent to its boundary face with the insulating material is particularly advantageous.

Described in the following are preferred production methods according to the invention, which afford obtaining upon or within an insulator geometrically accurately defined islands of a monocrystalline semiconductor material which may be made virtually as small as desired and which may serve to receive the active and passive components of the circuitry, the active components being produced, for example, by diffusion. By correspondingly dimensioning the areas or thicknesses of the insulating separating material between the islands, the coupling capacitances can be made as small as desired, thus securing a virtually complete ohmic and capacitive separation.

According to one embodiment of the method according to the invention, a polished face of a monocrystalline semiconductor plate consisting of semiconductor material of a given conductance type is provided with a thick layer of insulating material particularly the oxide of the semiconductor material itself. (This insulating layer is hereinafter referred to as "wafer.") Thereafter the semiconductor material is removed down to a residual thickness which is small in comparison with the thickness of the insulating wafer. In this thin semiconductor layer there are produced regions which penetrate the semiconductor layer down to the insulating wafer and effect an ohmic and capacitive separation of the remaining portions of the thin semiconductor layer. The active and passive components of the circuitry are then produced in these remaining portions or islands in a manner known as such, for example by diffusion, especially in accordance with the planar technique.

The following method is applicable for effecting the ohmic and capacitive separation. The surface of the thin semiconductor layer, facing away from the insulating wafer, is coated with a protective layer whose thickness is small in comparison with that of the semiconductor layer and which preferably consists of the oxide of the semiconductor material. Thereafter the protective coating is partially removed, thus exposing the surface of parts of the semiconductor layer. In these exposed surface portions of the semiconductor layer there are then produced the regions that effect the ohmic and capacitive separation. This is done by diffusing a dopant into the exposed surfaces of the semiconductor layer, the dopant producing a type of conductance opposed to that of the semiconductor layer, and the diffusion being carried out until the dopant penetrates down to the p-n junction of the insulating wafer.

According to another embodiment of the method according to the invention, the thin semiconductor layer is provided with recesses or cavities at the surface facing away from the insulating wafer, these recesses penetrating through the semiconductor layer down to the insulating wafer. The recesses are produced mechanically and/or chemically, for example by sandblasting or by etching. When applying the etching method, those portions of the semiconductor layer that are to receive the active and passive components of the circuitry must be protected from the etchant. This can be done by the conventional masking technique using wax or varnish as masking medium. Also applicable is an oxide masking as described in conjunction with the production of the isolating regions of the opposed conductance type.

Photolithographic processes are applicable for securing a defined geometric shape of the mutually isolated islands of semiconductor material. This is done after forming the recesses or after in-diffusion of dopant for producing the conductance type opposed to that of the semiconductor layer. The photolithographic process readily affords accurately determining the shape of the islands and their locality on the semiconductor film, even at smallest feasible geometrical dimensions.

A further, preferred method for producting the semiconductor integrated circuit in accordance with the invention is as follows. A monocrystalline plate of semiconductor material having a given conductance type is provided with recesses or cavities at one of its expansive, i.e. broad, faces which is previously polished. Thereafter an insulating wafer, preferably an oxide of the semiconductor material, is produced on the polished face and is given a large thickness in comparison with the depth of the recesses. Thereafter the material of the semiconductor layer is eliminated until the bottom of the recesses emerges at the opposite surface. Now only portions of the thin semiconductor layer remain between the recesses, these semiconductor layers being much thinner than the insulating wafer. The active and passive components of the circuitry are thereafter produced within the remaining insular portions of the semiconductor layer.

To further improve the electrical data of the circuit components, particularly of the transistors and especially for operation at very high frequencies, it is further advisable that, upon producing the recesses in the semiconductor layer, this layer be provided with a zone of increased conductivity, particularly at the face where the recesses are located.

According to the embodiment of the method of the invention first described above, the semiconducor layer, prior to forming the insulating wafer thereupon, is provided with a surface zone of increased conductivity at least at the portions facing the insulating layer. In the other embodiment of the method, the zone of increased conductivity is preferably produced after the semiconductor layer is provided with the recesses. In both cases the surface zone of increased conductivity may be produced by diffusion. However, the zone of increased conductivity may also be produced by epitaxial precipitation of semiconductor substance upon the semiconductor layer before or after the layer is provided with the recesses.

The relatively thick insulating wafer which carries the semiconductor layer is preferably grown by precipitation from the gaseous phase, preferably in accordance with the epitaxial technique. The epitaxial growing process, however, can be employed only if the insulating wafer has a lattice structure similar to that of the semiconductor crystal. This is the reason why it is particularly favorable to have the insulating wafer consist of an oxide of the semiconductor material.

When precipitating the insulating wafer material from the gaseous phase, an insulating deposit, as a rule, also occurs on the opposite broad face of the semiconductor layer. Such backside deposition of insulating material must be removed, for example by lapping or etching. However, the undesired deposition of insulating material can also be prevented by masking or covering the semiconductor layer during precipitation of the wafer-forming material.

After removal of any undesired deposition of insulating material, but prior to removing material from the semiconductor layer, it is advisable to secure planar parallelism between the free broad face of the insulating wafer and the broad face of the semiconductor layer respectively. This is done, for example, by lapping.

For protecting the active and passive components of the circuitry, it is further advisable to apply a protective coating upon the entire broad face ofo the thin semiconductor layer facing away from the insulating wafer. The protective coating is to be produced prior to forming the active and passive components and consists of insulating material, preferably the oxide of the semiconductor material. The thickness of the coating should be thin in relation to that of the semiconductor layer.

The invention will be further described with reference to the accompanying drawings, in which:

FIGS. 1 through 6 show schematically, by respective sectional views, six consecutive stages of a device being produced by a method according to the invention; and FIG. 7 shows schematically and in section a further embodiment of a semiconductor integrated circuit device according to the invention.

Shown in FIG. 1 is a monocrystalline plate 1 of silicon having n-type or p-type conductivity. This plate is used as a starting material of the method described presently. The bottom face 51 is polished. The top face 50 may either be lapped or polished. The epitaxial technique is then applied in order to grow a deposit 2 of silicon dioxide on the polished face 51 of the silicon plate of up to a thickness of 100 to 200 $\mu$m. (FIG. 2). If the opposite side 50 is not covered or masked, some slight amount 3 of silicon dioxide will also precipitate. The deposit on the lapped top side is etched away, thus restoring the lapped side 50 as shown in FIG. 3.

Thereafter, the thick deposit of silicon dioxide 2 on the polished side of the silicon plate 1 and the remaining wafer 2 of silicon dioxide are exactly planar and parallel to each other. The resulting stage is illustrated in FIG. 4.

Now the silicon side is accurately lapped down, then polished and etched until the carrier wafer 2 of silicon dioxide, subsequently serving as a substrate of the integrated circuit, carries only a thin monocrystalline layer or film 4 of silicon as the remainder of the original semiconductor plate. The layer 4 may have a thickness of 10 to 20 $\mu$m., for example.

The silicon layer 4 is then subjected to conventional oxidation and thus covered by a coating of silicon dioxide whose thickness is slight in comparison with that of the silicon layer 4. For example, the coating may have a thickness of about 1 $\mu$m. A photolithographic process and subsequent etching are employed for removing a grid-like pattern of frame-shaped portions from the oxide coating. A dopant is then diffused into the silicon through the resulting frame-shaped openings. If the silicon layer has n-type conductance, an acceptor substance is diffused down to such a depth that the resulting p-n junction reaches the insulating substrate or wafer of silicon dioxide 2. Conversely, if the original silicon layer has p-type conductance, a donor is diffused through the frame-shaped openings in the same manner.

As a result, a semiconductor device as exemplified in FIG. 6 is obtained. This device comprises the substrate wafer 2 of silicon dioxide and the thin top layer of silicon composed of those individual portions or islands 12, 13, 14 and 15 that remained unaffected by the last-mentioned processing steps and thus retained the conductivity type of the original silicon layer. Produced within the islands 12, 13, 14 and 15 are respective isolating regions 6, 7 and 8 of the opposed conductivity type which form p-n junctions 9, 10, 11 together with the semiconductor layer and completely penetrate the semiconductor layer. The portions 5, 52, 53 and 54 of the silicon dioxide coating serve as masking during diffusion-doping of the isolating regions, whereas the portions 55, 56, 57 generally grow during diffusion on the semiconductor surface. This portion of the oxide coating may thereafter serve as masking for the next following production of the active and passive circuitry components, in the manner known in the planar technique. In the semiconductor device illustrated in FIG. 6, the thin monocrystalline layer of silicon is subdivided into n-type insular regions 12 to 15 of which each is bordered by an insulating bottom and by p-type side walls. The capacitive coupling between each two such regions in extremely slight since it can be due only to the minute areas of the p-n junctions at the lateral walls.

The device shown in FIG. 7 corresponds basically to that described above, except that for improving the electrical data of the integrated circuitry components, the silicon is more highly doped at the boundary zone adjacent to the silicon dioxide substrate than elsewhere. The more highly doped zones denoted by 39 and 40, have a much higher electrical conductivity than the major portion of each silicon island.

In the embodiment according to FIG. 7, the zones 39 and 40 are produced prior to precipitation of the insulating substrate 2. Applicable for this purpose, for example, is the epitaxial technique or doping by diffusion.

The mutually isolated insular regions produced in the above-described manner are then provided with active and passive circuit components in accordance with the methods conventional in integrated circuit and microcircuit techniques. As a rule, this is done by indiffusion, and these components are then connected with each other by deposition of conductive paths to form the integrated circuit, the deposition of the connections being effected in the conventional manner, for example by vapor deposition of metal such as gold.

In semiconductor integrated circuit devices according to the invention, the individual monocrystalline regions or islands of the thin semiconductor layer may also consist of extremely high-ohmic weakly doped, for example intrinsically conducting material. Furthermore, semiconductor materials other than silicon may be used, for example, germanium or gallium arsenide, indium antimonide, and other $A^{III}B^{V}$ semiconductor compounds.

The individual processing steps described above are known as such. Particularly useful for epitaxially growing a silicon dioxide on silicon is the following method. The silicon carrier plate is heated to a temperature of 1180 to 1280° C. within a processing vessel as conventionally employed for silicon epitaxy. The reaction gas from which the precipitation is to take place is continuously supplied into the vessel, the remaining gas being simultaneously discharged therefrom. The reaction gas may consist of a mixture of $H_2$ with $SiHCl_3$ and $CO_2$, or also of a mixture of $H_2$, $SiCl_4$ and $CO_2$. In both cases the molar ratio of the silicon compound to hydrogen is smaller than 1%. The molar ratio of carbon dioxide to hydrogen amounts to several percent and particularly is about three times the molar ratio of silicon compound to hydrogen.

To those skilled in the art, it will be obvious from a study of this disclosure that our invention permits of various modifications with respect to materials, geometrical shapes, and other details, and hence may be given embodiments other than particularly illustrated and described herein, without departing from the essential features of our invention and within the scope of the claims annexed hereto.

We claim:

1. The method of producing a semiconductor integrated circuit device, which comprises producing a carrier wafer of electrically insulating material on a polished face of a monocrystalline plate of semiconductor substance having one type of conductivity, removing semiconductor substance from said plate to reduce it to a layer of slight thickness relative to that of said wafer, covering the surface of the semiconductor layer with an insulating coating having smaller thickness than said layer, removing the coating in an area pattern corresponding to that of the isolating regions to be produced, and then producing said isolating regions at the thus exposed surface areas of said semiconductor layer by diffusing into the exposed surface areas of said semiconductor layer a dopant for the conductivity type opposed to that of the layer substance, the diffusion being carried out to the depth required to have the resulting p-n junction reach said insulating wafer so as to divide the layer into mutually isolated separated regions of which each has said same type of conductivity, and thereafter producing integrated-circuit components within said respective separated regions.

2. The method according to claim 1, which comprises producing said carrier insulating wafer by precipitating the oxide of said semiconductor substance from the gaseous phase onto said face of said monocrystalline plate of semiconductor substance.

3. The method according to claim 1, which comprises providing said semiconductor plate, prior to producing said carrier insulating wafer, with a surface zone of increased conductivity at least at the surface areas subsequently adjacent to the insulating wafer material.

4. The method according to claim 1, which comprises producing said carrier insulating wafer by precipitation of oxide from the gaseous phase onto the polished face of said semiconductor plate, and covering during precipitation the opposite face of said plate.

5. The method according to claim 1, which comprises subjecting the respective free faces of said semiconductor plate and said carrier insulating wafer to material-removing processing to make said two faces planar and parallel to each other before reducing said semiconductor plate to said slight layer thickness.

6. The method according to claim 1, which compries covering the surface of said layer on the entire side facing away from said carrier insulating wafer with an insulating coating prior to producing said circuit components in said separated regions.

7. The method according to claim 6, which comprises producing said carrier insulating wafer and said insulating coating from oxide of said semiconductor substance.

References Cited

UNITED STATES PATENTS

| | | | |
|---|---|---|---|
| 3,390,022 | 6/1968 | Fa | 147—33 |
| 3,290,753 | 12/1966 | Chang. | |
| 3,320,485 | 5/1967 | Buie | 317—101 |
| 3,332,137 | 7/1967 | Kenney | 29—423 |

OTHER REFERENCES

E. Stern: IBM Technical Disclosure Bulletin, "Planar Scanistor Arrays," vol. 7, No. 11, April 1965, p. 1101, (Copy obtainable in 317–101A).

WILLIAM I. BROOKS, *Primary Examiner*.

U.S. Cl. X.R.

29—580; 148—175, 187; 317—235